United States Patent [19]

Sandow et al.

[11] Patent Number: 4,479,831
[45] Date of Patent: Oct. 30, 1984

[54] METHOD OF MAKING LOW RESISTANCE POLYSILICON GATE TRANSISTORS AND LOW RESISTANCE INTERCONNECTIONS THEREFOR VIA GAS DEPOSITED IN-SITU DOPED AMORPHOUS LAYER AND HEAT-TREATMENT

[75] Inventors: Peter M. Sandow, Sunnyvale; Barry L. Chin, San Diego, both of Calif.

[73] Assignee: Burroughs Corporation, Detroit, Mich.

[21] Appl. No.: 493,769

[22] Filed: Jun. 15, 1983

Related U.S. Application Data

[63] Continuation of Ser. No. 186,977, Sep. 15, 1980, abandoned.

[51] Int. Cl.³ .................... H01L 21/263; H01L 7/54
[52] U.S. Cl. ...................... 148/1.5; 29/571;
29/591; 148/175; 148/187; 357/59
[58] Field of Search .............. 148/1.5, 175, 187;
29/571, 591; 357/59

[56] References Cited

PUBLICATIONS

Chou, IBM-TDB., 14 (1971) 250.

Primary Examiner—Upendra Roy
Attorney, Agent, or Firm—Charles J. Fassbender; Kein R. Peterson

[57] ABSTRACT

In the disclosed method, a transistor is fabricated by depositing an unpatterned layer of silicon on an insulating layer over a surface of a semiconductor substrate, with the silicon layer being deposited in an amorphous state to improve its uniformity in thickness and smoothness. Subsequently, while the silicon layer is still in the amorphous state, it is patterned by removing selected portions to form a gate. This patterning in the amorphous state improves the gates edge definition. Thereafter, the patterned amorphous silicon layer is heated to change it to polycrystalline silicon, thereby increasing its stability and conductivity.

8 Claims, 11 Drawing Figures

FIG. IA
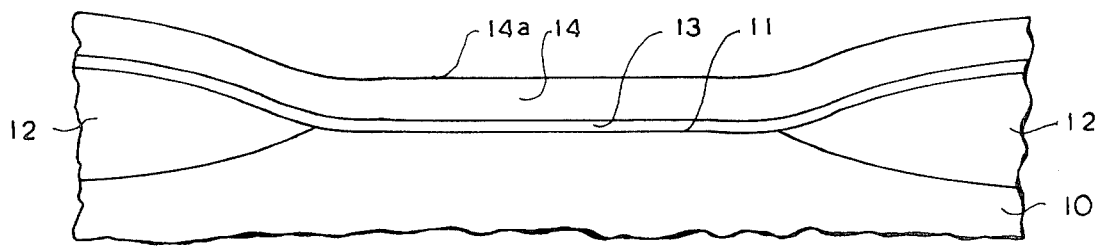
FIG. IB
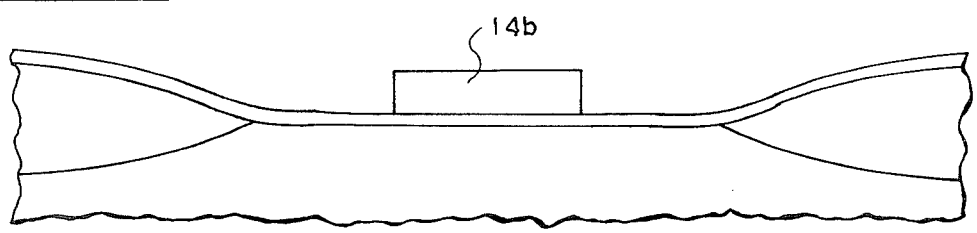
FIG. IC
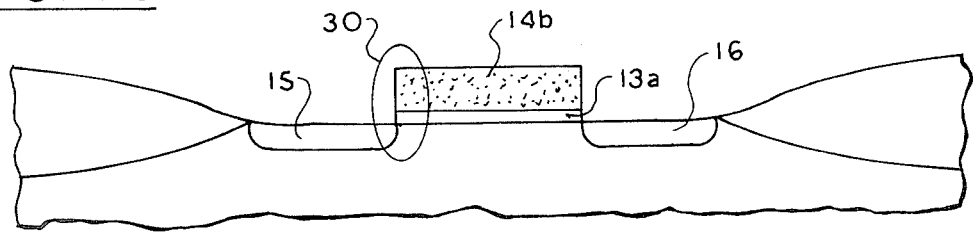
FIG. 2A
FIG. 2B
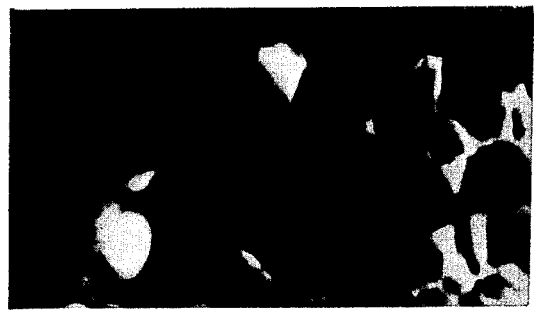

METHOD OF MAKING LOW RESISTANCE POLYSILICON GATE TRANSISTORS AND LOW RESISTANCE INTERCONNECTIONS THEREFOR VIA GAS DEPOSITED IN-SITU DOPED AMORPHOUS LAYER AND HEAT-TREATMENT

This is a continuation of application Ser. No. 186,977, filed Sept. 15, 1980, now abandoned.

BACKGROUND OF THE INVENTION

This invention relates to integrated circuits and methods of their fabrication; and more particularly the invention relates to field-effect transistors and methods for fabricating their gate.

In the prior art, the gates of field-effect transistors were fabricated by depositing an unpatterned layer of polycrystalline silicon on an insulating layer over a surface of a semiconductor wafer. This silicon layer was deposited in a polycrystalline state (as opposed to an amorphous state) to increase its stability and conductivity. Subsequently, the silicon layer was patterned by removing selected portions of it to form a gate.

One problem, however, with this prior art process, is that the thickness of the polycrystalline silicon layer cannot be uniformly controlled across the wafer. Typically, the thickness variations are large enough to cause a substantial portion (e.g.—20%) of the wafer's surface to be unuseable. This unuseable portion generally occurs at the wafer's perimeter.

Another problem with the above prior art process is that the accuracy with which the edge of the transistor's gate can be defined is limited by the orientation of the polycrystals. That is, both a plasma etch and a wet chemical etch attack various portions of the polycrystalline layer at different rates depending upon the grain boundaries of the layer. This then places a limitation on the accuracy with which the gate's edge can be reproduced.

Still another problem with the above described prior art process, is that on a microscopic level, a deposited polycrystalline surface is not smooth; but instead it contains thousands of hillhocks. These hillhocks, in turn, can lower the adhesion between the gate and any overlying material; and they also can lower the breakdown voltage of the patterned polycrystalline layer.

Accordingly, a primary object of this invention is to provide an improved field-effect transistor and method of fabricating the same.

Another object of the invention is to provide an improved method of fabricating a patterned polycrystalline silicon layer in an integrated circuit.

BRIEF SUMMARY OF THE INVENTION

These and other objects are accomplished in accordance with the invention by depositing an unpatterned layer of amorphous silicon on an insulating layer over a surface of a semiconductor substrate. The silicon layer is deposited in an amorphous state to improve its uniformity in thickness and smoothness. Subsequently, while the silicon layer is still in the amorphous state, it is patterned by removing selected portions of it to form a gate. This patterning in the amorphous state improves the gate's edge definition. Thereafter, the patterned amorphous silicon layer is heated to change it to polycrystalline silicon, thereby increasing its stability and conductivity.

BRIEF DESCRIPTION OF THE DRAWINGS

Various features and advantages of the invention will best be understood by reference to the following detailed description and accompanying drawings wherein:

FIGS. 1A-1C are greatly enlarged cross-sectional views of a transistor that is constructed in accordance with the invention taken at various stages of the fabrication process.

FIGS. 2A and 2B are microphotographs of a portion of the transistor's gate in FIGS. 1B and 1C illustrating their respective amorphous and polycrystalline structures.

DETAILED DESCRIPTION

Figure 3A:
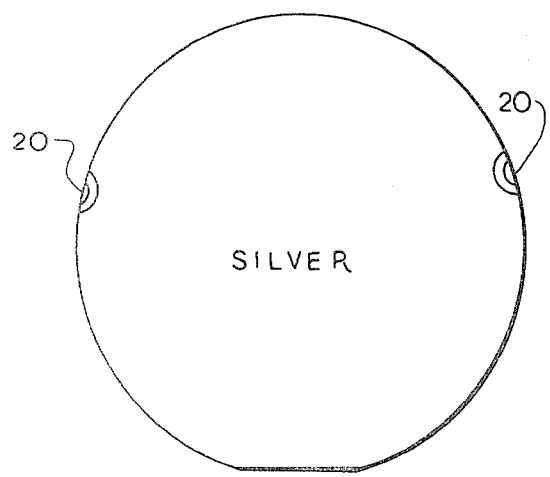
FIGS. 3A and 3B are actual size sketches of a typical unpatterned amorphous silicon layer and a typical unpatterned polycrystalline layer deposited on respective semiconductor wafers.

Referring now to FIGS. 1A-1C, a method of fabricating a field-effect transistor in accordance with the invention will be described. In this method, the transistor is formed on a single crystal semiconductor substrate 10 having a surface 11 on which field oxide regions 12 define the transistor's perimeter. A thin insulating layer 13, such as 300 Å of $SiO_2$, also lies on surface 11 and regions 12 to insulate the transistor's gate from the substrate.

Now, in accordance with the novel steps of the invention, an unpatterned layer of amorphous silicon 14 is formed on the insulating layer 13. Preferably, amorphous silicon layer 14 is formed by a chemical vapor deposition at temperatures no higher than 550° C. These relatively low temperatures insure that the silicon in layer 14 will be deposited in an amorphous state. By comparison, silicon deposited at temperatures of at least 590° C. will assume a polycrystalline state; while silicon deposited at a temperature of 575° C. will be about 70% amorphous with some polycrystalline regions imbedded therein.

Suitably, the thickness of layer 14 is 4,000 Å. Also, layer 14, as deposited, may be either doped or undoped with selected impurity atoms, such as arsenic or phosphorous. For example, a 4,000 Å thick arsenic doped amorphous silicon layer 14 can be deposited on insulating layer 13 by exposing it to a gaseous mixture of 2% phosphorus, 40% silane, and 58% of a carrier gas such as nitrogen at pressures of 1.1 Torr and a temperature of 550° C. for approximately 200 minutes.

In either the doped or undoped case, however, test results show that surface 14a of layer 14 is substantially smoother when it is deposited in an amorphous state than when it is deposited in a polycrystalline state. Also, the thickness of layer 11 is substantially more uniform when it is deposited in an amorphous state than when it is deposited in a polycrystalline state. Further evidence of these points will be described shortly in conjunction with FIGS. 3, 4, and 5.

Following the above deposition step, layer 14 is patterned to form a gate 14b for the transistor. The result of this patterning step is illustrated in FIG. 1B. Suitably, the patterning of layer 14 is performed by removing portions of that layer with anisotropic planar plasma etch. Alternatively, a wet chemical etchant such as KOH may be utilized.

Using either type of patterning procedure, the edge definition of gate 14b is as good or better than that which is obtained when a polycrystalline layer of silicon is patterned. A possible explanation for this is that in polycrystalline silicon, the microscopic grain boundaries are selectively attacked by the etchant depending upon the grains' orientation; whereas in amorphous silicon, there are no crystalline orientations. In any case, this improvement in edge definition is observable as will be described shortly in conjunction with FIGS. 4 and 5.

Turning now to FIG. 1C, the remaining novel steps of the disclosed process will be described. Initially, that portion of insulating layer 13 which is not covered by gate 14a, is removed by a suitable selective etchant, such as a 20:1 solution of water and BHF. This leaves an insulating region 13a under the gate. Thereafter, source and drain regions 15 and 16 are formed in substrate 10 by implanting dopant atoms into those regions. Suitably, arsenic atoms are implanted at an energy of 50 kev and a density of $4 \times 10^{15}$ atoms per square centimeter.

Subsequently, the above described structure is annealed. This anneal preferably occurs at temperatures of 800° C.–1,000° C. in an atmosphere of nitrogen for 40 minutes. As a result, the source and drain regions 15 and 16 are "activated" (that is—any crystal damage caused by the above implant is repaired); and at the same time, gate 14b changes in structure from amorphous silicon to polycrystalline silicon. This change in state is indicated in FIG. 1C by the "dots" in gate 14b.

Experimental proof that gate 14b actually changes from amorphous silicon to polycrystalline silicon as the result of the above annealing step is given in FIGS. 2A and 2B. FIG. 2A is a microphotograph of gate 14b taken prior to its anneal; and FIG. 2B is a microphotograph of gate 14b taken after its anneal. The scale of these microphotographs is indicated in the figures.

This scale is small enough to make polycrystalline structures visible. See FIG. 2B, for example, wherein the multiple crystals of gate 14b are clearly seen. By comparison, no such crystals can be seen in FIG. 2A. This change from amorphous to polycrystalline silicon has also been experimentally verified by studying diffraction patterns of electrons transmitted through gate 14b prior to and after its anneal.

In the amorphous state, gate 14b has a relatively high resistivity; whereas in the polycrystalline state, it has a relatively low resistivity. For example, the resistivity of gate 14b in the amorphous state is approximately $10^2$ $\Omega$-cm; while in the polcrystalline state, its resistivity is approximately $10^{-3}$ $\Omega$-cm. This latter resistivity is at least as low as that which is obtained when layer 14 is initially deposited in a polycrystalline state.

At the same time, however, the above mentioned improvements in smoothness and uniformity in thickness of layer 14, as well as improved edge definition in the patterned layer, are achieved by depositing and patterning layer 14 in an amorphous state. This is evidenced by comparing FIGS. 3A, 4A, and 5A, respectively, with FIGS. 3B, 4B, and 5B.

FIG. 3A is a sketch of a semiconductor wafer on which a typical layer 11 of amorphous silicon has been deposited as described above in conjunction with FIG. 1A. Silicon layers deposited in that manner have a silver color that is uniform over their entire surface, except for a pair of small regions 20 at their perimeter where the wafer is held during the deposition process. This uniformity in color indicates that the thickness of layer 11 is also uniform. Actual experimental measurements by reflectance spectrophotometry on several wafers indicates a thickness variation of only ±2% across the surface.

Figure 3B:
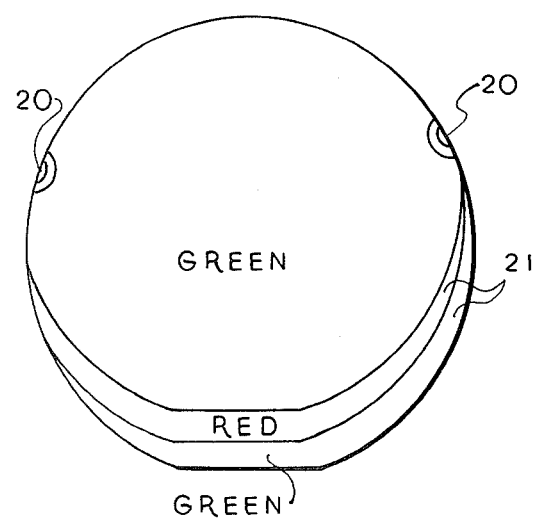

By comparison, FIG. 3B is a sketch of a semiconductor wafer having a typical polycrystalline silicon layer deposited thereon. Visual inspection of such a wafer shows that its color is nonuniform. Typically, the polycrystalline surface has several elongated regions 21 in which the color changes. These regions 21 are in addition to the above described regions 20 at the perimeter of the wafer where it is held during processing.

This nonuniformity in color across the polycrystalline surface indicates a nonuniformity in the layer's thickness. Actual experimental measurements of thickness of this layer on several wafers indicated a variation of ±5%. Also typically, regions 21 typically cover approximately 20% of the entire wafer area; whereas regions 20 typically cover less than 5% of the wafer area.

Figure 4A:
FIGS. 4A and 4B are cross-sectional microphotographs respectively illustrating a typical patterned amorphous silicon layer and a typical patterned polycrystalline silicon layer.
Figure 4B:
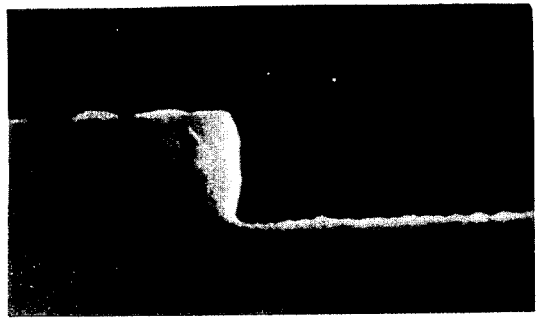

Turning now to FIGS. 4A and 4B, both the improved edge definition and improved surface smoothness which is obtained through this invention can be clearly seen. FIG. 4A is a microphotograph of a region 30 of a transistor fabricated in accordance with the process of FIGS. 1A–1C; whereas FIG. 4B is a microphotograph of a similar region of another transistor wherein the silicon layer from which the gate was patterned was initially deposited in a polycrystalline state. Visual inspection of these two figures clearly shows that gate 14b in FIG. 4A has a sharper vertical edge and a smoother horizontal surface than does the gate of the transistor of FIG. 4B.

Figure 5A:
FIGS. 5A and 5B are isometric microphotographs respectively illustrating a typical patterned amorphous silicon layer and a typical patterned polycrystalline silicon layer.
Figure 5B:

This improvement in edge definition and surface smoothness is also evident by inspection of FIGS. 5A and 5B. FIG. 5A is an isometric microphotograph of the gate of FIG. 4A; whereas FIG. 5B is an isometric microphotograph of the gate of FIG. 4B. Here again, the improvement in edge definition and surface smoothness is clear and self-evident.

A preferred process for fabricating transistors in accordance with the invention has now been described in detail. In addition, however, various changes and modifications may also be made to these details without departing from the nature and spirit of the invention. For example, while the above details have been directed towards the fabricating of only a single transistor, multiple interconnected transistors forming an integrated circuit may also be fabricated with this invention. Also, while the above details have focussed on the processing of a silicon layer 11 which lies on an insulating layer which in turn lies on a substrate, double level silicon— that is, silicon that lies on an insulating layer on top of layer 14—can also be processed via this invention.

Accordingly, it is to be understood that the invention is not limited to said details but is defined by the appended claims.

What is claimed is:

1. A method of fabricating a plurality of transistors across essentially the entire surface of a crystalline wafer; said transistors being of the type that have source and drain regions in said wafer with low resistance gates and low resistance interconnections lying thereabove; said method including the steps of:

forming an insulating layer across the surface of said wafer with a thickness that is suitable for separating said transistor gates from said wafer;

exposing said insulating layer to a gas mixture of silicon and dopant atoms to deposit thereon an unpatterned layer of in-situ doped silicon, with said silicon layer being deposited in an amorphous state to improve the layer's uniformity in thickness and smoothness across the entire surface;

patterning said silicon layer to the shape of said transistor gates and said interconnections therefor while said silicon is in said amorphous state to improve the accuracy with which the gates and interconnections are defined by removing selected portions thereof;

implanting said source and drain regions of said wafer with dopant atoms; and heating said implanted source and drain regions to repair any crystal damage caused by said implant while simultaneously heating said patterned amorphous layer of silicon to change it to a patterned polycrystalline layer and thereby decrease the electrical resistivity of said gates and interconnections to about $10^{-3}$ $\Omega$-cm.

2. A method according to claim 1 wherein said silicon layer is fabricated to a thickness of about 4000 Å with a sheet resistance of about 25 $\Omega/\square$.

3. A method according to claim 1 wherein said silicon layer is fabricated by exposing said insulating layer to said gas mixture at a pressure of about 1.1 torr.

4. A method according to claim 3 wherein said gas mixture is comprised of about 2% dopant atoms, 40% silane, and 58% of a carrier gas.

5. A method according to claim 4 wherein said insulating layer is exposed to said gas mixture at a temperature of about 550° C.

6. A method according to claim 5 wherein said heating step occurs at temperatures of between 800° C. and 1000° C. for about 40 minutes.

7. A method according to claim 6 wherein said wafer is a semiconductor wafer.

8. A method according to claim 7 wherein said insulating layer is about 300 Å thick.

* * * * *